United States Patent
Kim

(10) Patent No.: US 7,400,201 B2
(45) Date of Patent: Jul. 15, 2008

(54) APPARATUS AND METHOD FOR REDUCING DRAIN MODULATION OF HIGH POWER TRANSISTOR

(75) Inventor: Kyoung-Tae Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 135 days.

(21) Appl. No.: 11/480,510

(22) Filed: Jul. 5, 2006

(65) Prior Publication Data
US 2007/0008039 A1    Jan. 11, 2007

(30) Foreign Application Priority Data
Jul. 7, 2005    (KR) .................. 10-2005-0060999

(51) Int. Cl.
*H03F 3/04*    (2006.01)
(52) U.S. Cl. ..................... 330/296; 330/285
(58) Field of Classification Search .............. 330/285, 330/296, 277, 302
See application file for complete search history.

(56) References Cited

U.S. PATENT DOCUMENTS

| | | | | |
|---|---|---|---|---|
| 3,984,783 A | * | 10/1976 | Bickley | 330/296 |
| 6,111,466 A | * | 8/2000 | Mokhtar et al. | 330/296 |
| 6,437,646 B2 | * | 8/2002 | Masahiro | 330/284 |
| 6,657,498 B2 | * | 12/2003 | Park et al. | 330/285 |
| 7,315,211 B1 | * | 1/2008 | Lee et al. | 330/285 |

* cited by examiner

*Primary Examiner*—Henry K Choe
(74) *Attorney, Agent, or Firm*—Roylance, Abrams, Berdo & Goodman, L.L.P.

(57) ABSTRACT

An apparatus and a method for reducing drain modulation in a high power amplifier are provided, in which an adder supplies a current corresponding to a voltage reduced by a drain modulation, and a bias unit adds the current supplied from the adder to a DC bias and supplies the added current to a drain of a transistor. Accordingly, the drain modulation occurring in the transistor can be minimized and an output characteristic of the high power transistor can be improved.

7 Claims, 3 Drawing Sheets

APPARATUS AND METHOD FOR REDUCING DRAIN MODULATION OF HIGH POWER TRANSISTOR

CROSS-REFERENCE TO RELATED PATENT APPLICATIONS

This application claims the benefit under 35 U.S.C. § 119(a) of a Korean Patent Application filed in the Korean Intellectual Property Office on Jul. 7, 2005 and assigned Serial No. 2005-60999, the entire disclosure of which is hereby incorporated by reference.

BACKGROUND OF THE INVENTION

1. Field of the Invention

The present invention relates generally to a high power transistor. More particularly, the present invention relates to an apparatus and a method for reducing drain modulation of a high power transistor.

2. Description of the Related Art

High power transistors (for example, Lateral Double diffused MOS (LDMOS), gallium arsenide (GaAs) transistor, and the like) for high power amplifiers have high power and use a current of several amperes. Specifically, in the case of a Code Division Multiple Access (CDMA) that amplifies a modulated signal, magnitude of the input signal continuously varies with time and thus an amount of output current continuously varies. Referring to FIG. 1, when magnitude of an input signal 101 increases, an amount of output current also increases. Thus, a DC bias voltage 102 applied to a drain of a transistor is instantaneously reduced. This phenomenon is called a drain modulation. The drain modulation occurs much more often when a modulated signal having a specific bandwidth is amplified in CDMA or Wideband Code Division Multiple Access (WCDMA). The drain modulation is caused by resistive components existing in inductors, bias lines used to apply a bias to a high power transistor, or by resistive components of the transistor itself.

In the drain modulation, the AC component characteristic acts as power noise in the transistor of the high power amplifier, degrading performance of the transistor. The drain modulation influences a spurious characteristic (Adjacent Channel Power Ratio (ACPR), Adjacent Channel Leakage Power Ratio (ACLR), and the like) that is one of important factors indicating the performance of the high power amplifier. Also, the drain modulation causes a memory effect phenomenon. Hence, when the amplifier is implemented with actual transistors, the technical application of pre-distortion is difficult.

To minimize the drain modulation and maximize the performance of the amplifier, the amplifier is implemented using capacitors having large capacitance in the bias lines. However, the drain modulation cannot be completely removed only using the capacitors. Also, the use of the capacitors influences the switching speed of the transistor, resulting in the performance degradation of the transistor. Moreover, the amplifier has to be designed to be large in size, thus increasing its price. Consequently, the amplifier having the above-described structure has no benefit of performance in a real channel environment.

Accordingly, there is a need for an improved apparatus and method that minimizes drain modulation of a high power transistor.

SUMMARY OF THE INVENTION

An aspect of exemplary embodiments of the present invention is to address at least the above problems and/or disadvantages and to provide at least the advantages described below. Accordingly, an aspect of exemplary embodiments of the present invention is to provide an apparatus for reducing drain modulation of a high power transistor.

Another object of exemplary embodiments of the present invention is to provide an apparatus for minimizing drain modulation and improving amplification characteristic of a transistor by using an adder and a bias unit.

According to one aspect of the present invention, a bias controlling apparatus for a high power amplifier includes an adder for supplying a current corresponding to a voltage reduced by a drain modulation, and a bias unit for adding the current supplied from the adder to a DC bias and supplying the added current to a drain of a transistor.

Other objects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other objects, features and advantages of certain exemplary embodiments of the present invention will be more apparent from the following detailed description taken in conjunction with the accompanying drawings in which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Hereinafter, an apparatus for reducing drain modulation of a high power transistor according to an exemplary embodiment of the present invention will be described in detail.

Figure 2:
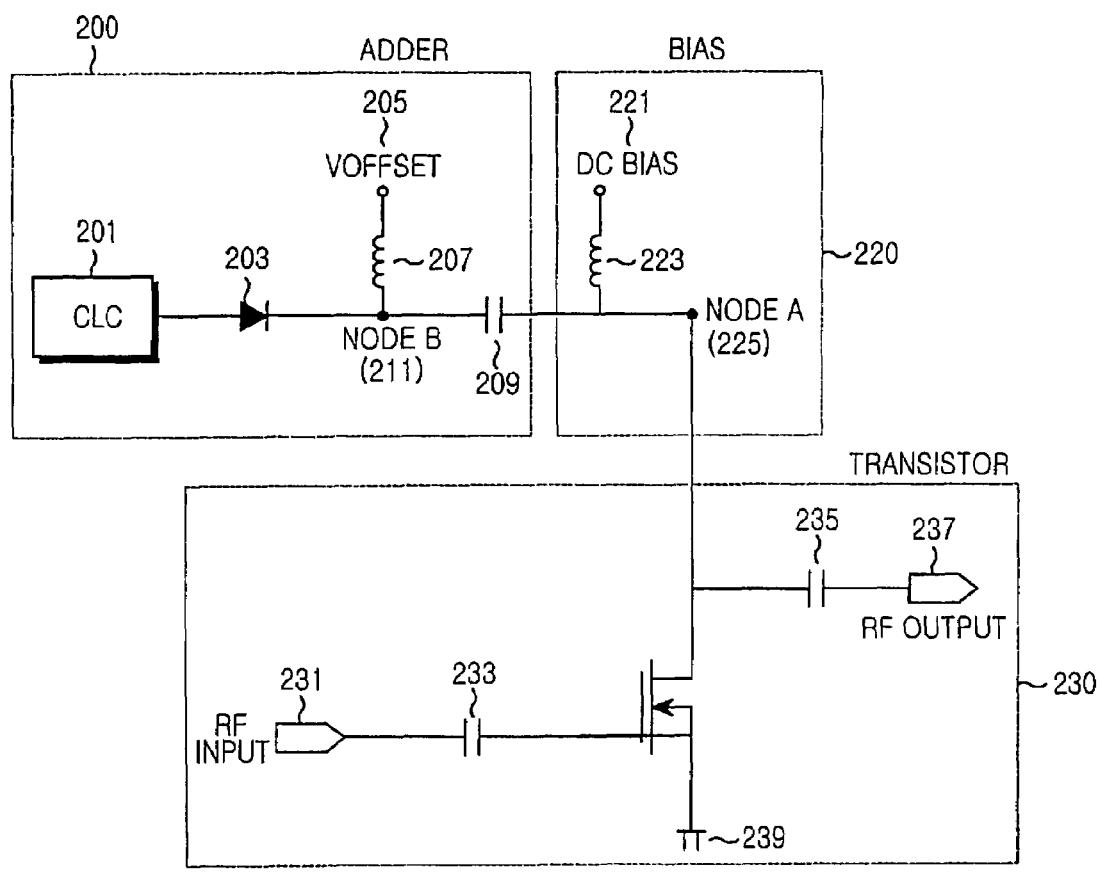
FIG. 2 is a circuit diagram of a high power amplifier having a reduced drain modulation according to an exemplary embodiment of the present invention.

FIG. 2 is a circuit diagram of a high power amplifier with a reduced drain modulation according to an exemplary embodiment of the present invention.

Referring to FIG. 2, the high power amplifier includes an adder 200, bias unit 220, and transistor 230. The adder 200 supplies the bias unit 220 with a current corresponding to a voltage reduced by the drain modulation. The bias unit 220 adds the current supplied from the adder 200 to a DC bias and supplies the added current to the transistor 230. The transistor 230 uses the current supplied from the bias unit 220 as a power source.

The adder 200 includes a voltage source 201, diode 203, first inductor 207, and capacitor 209. The voltage source 201 supplies a current to an anode of the diode 203. The anode of the diode 203 is connected to the voltage source 201 and a cathode is connected to one terminal of the capacitor 209. The first inductor 207 has one terminal connected to an offset voltage 205 and the other terminal connected to the cathode of the diode 203. The capacitor 209 has one terminal connected to the cathode of the diode 203 and the other terminal connected to the other terminal of a second inductor 223. The voltage source 201 may be implemented with a current limited circuit (CLC) that supplies a constant current. Also, the bias unit 220 includes the second inductor 223 having one terminal connected to a DC bias 221 and the other terminal connected to the other terminal of the capacitor 209.

In FIG. 2, when magnitude of a radio frequency (RF) input signal 231 applied to the transistor 230 increases, drain modulation occurs at a node A 225 so that a voltage at the node A 225 is instantaneously reduced to be lower than the DC bias 221. The drain modulation is caused by resistive components existing in the transistor or the second AC blocking inductor 223 that supplies the DC bias 221. For example, when the magnitude of the signal 231 applied to the transistor 230 increases, an amount of current flowing from the drain of the transistor 230 (for example, the node A 225) to the source 239 of the transistor 230 increases in proportion to the magnitude of the signal 231. At this point, a voltage drop occurs due to the increase in the amount of current flowing from the drain 225 to the source 239 of the transistor 230, and the resistive components existing in the transistor 230. Due to the voltage drop, the drain modulation explained in FIG. 1 occurs at the node A 225. Capacitors 233 and 235 are disposed between the RF input signal 231 and the transistor 230 and between the transistor 230 and the RF output signal 237. These capacitors 233 and 235 are DC blocking capacitors that prevent a DC current from flowing from the RF input signal 231 and the RF output signal 237.

Figure 1:
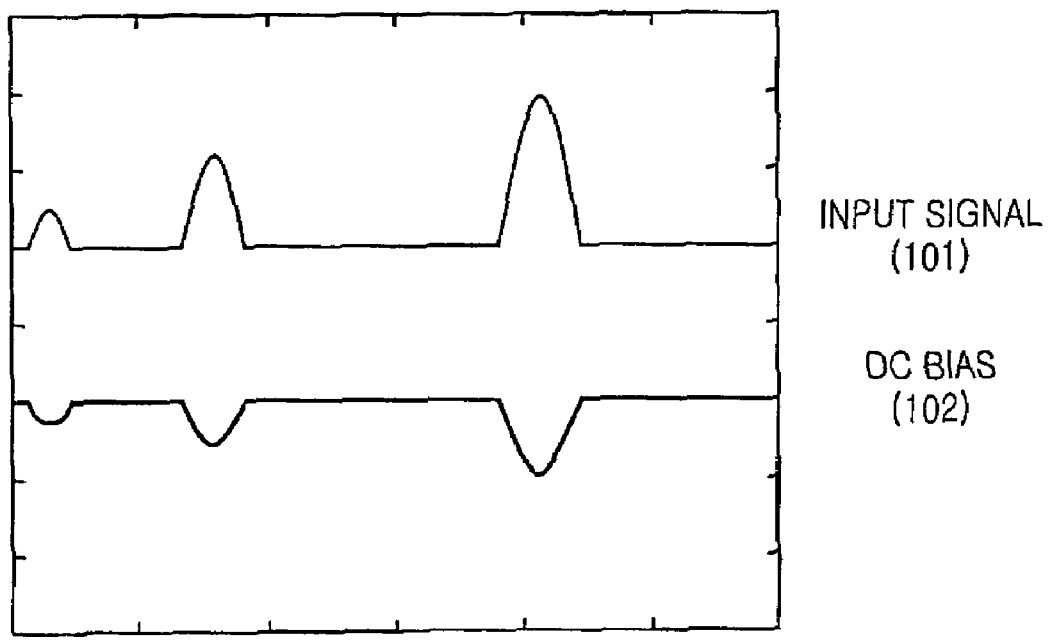
FIG. 1 is a graph illustrating drain modulation of a conventional high power transistor.

As illustrated in FIG. 1, the drain modulation appears as an AC component of the voltage at the node A 225, and the AC component passes through the capacitor 209 and appears at the node B 211. Because the capacitor 209 is the DC blocking capacitor, the AC component may pass through the capacitor 209 and appear at the node B 211. That is, when the drain modulation occurs, a voltage waveform in which the AC component is added to the DC bias 221 is generated at the node A 225. Also, the AC component applied through the DC blocking capacitor 209 and the offset voltage 205 of the DC component applied through the first AC blocking inductor 207 are added at the node B 211. Finally, a voltage waveform swinging from the offset voltage to a low voltage is generated. The voltage waveform at the node B 211 causes the diode 203 to operate. At this point, the AC component is a voltage component that swings from 0 V to a negative voltage, and the inductor 207 disposed between the offset voltage 205 and the node B 211 is the first AC blocking inductor that blocks the AC component while passing only the DC component.

The diode 203 allows a current to flow in one direction, that is, from the anode to the cathode, but blocks the current in the opposite direction. To allow the current flow, a predetermined voltage (for example, 0.7 V) must be applied to the diode 203. For example, a voltage difference between both terminals of the diode 203 must be more than 0.7 V. A voltage of an input terminal must be higher than the voltage of an output terminal by more than 0.7 V. The input terminal of the diode 203 is supplied with a constant voltage (generally 0.7 V) from the voltage source 201. The output terminal of the diode 203 maintains the DC offset voltage, which is applied through the first AC blocking inductor 207, at the same level as the constant voltage supplied from the voltage source 201. When the drain modulation occurs, the AC component applied through the capacitor 209 is added and thus the voltage waveform swinging from the offset voltage to a low voltage is generated at the output terminal of the diode 203.

In an exemplary implementation, due to the drain modulation, the voltage at the output terminal (that is, the node B 211) of the diode 203 swings from the offset voltage to a low voltage. Simultaneously, an AC voltage swinging from 0 V to a positive voltage is applied to the diode 203. That is, an amount of AC current supplied from the voltage source 201 increases, opposite to the voltage waveform at the node B 211. Then, when the voltage difference between the input terminal and the output terminal of the diode 203 becomes 0.7 V, that is, when a voltage across the diode 203 becomes 0.7 V, the diode 203 is turned on. At this point, a current supplied from the voltage source 201 is transferred to the capacitor 209. The AC current component is supplied to the bias unit 220 through the DC blocking capacitor 209. Thus, an instantaneously increased current generated at the node A 225 is supplied. During the period in which the voltage is instantaneously reduced, a current corresponding to the reduced voltage is supplied from the voltage source 201, so that the instantaneous voltage reduction at the node A 225 is offset.

When the RF input signal 231 applied to the transistor 230 is maintained at a constant level, the voltage at the node A 225 is also maintained at a constant level. Accordingly, the drain modulation does not occur so that the voltage is not instantaneously reduced. Thus, the AC component as illustrated in FIG. 1 is not generated at the voltage of the node A 225, and the DC voltage corresponding to the DC bias 221 is presently maintained. Also, because the AC component is not applied to the DC bias 221, the voltage of the node B 211 is not influenced. Therefore, the constant voltage supplied from the voltage source 201 to the diode 203 is maintained at the same level as the DC offset voltage applied through the first AC blocking inductor 207 to the node B 211, so that the diode 203 does not operate. Generally, the constant voltage and the offset voltage are 0.7 V.

Figure 3:
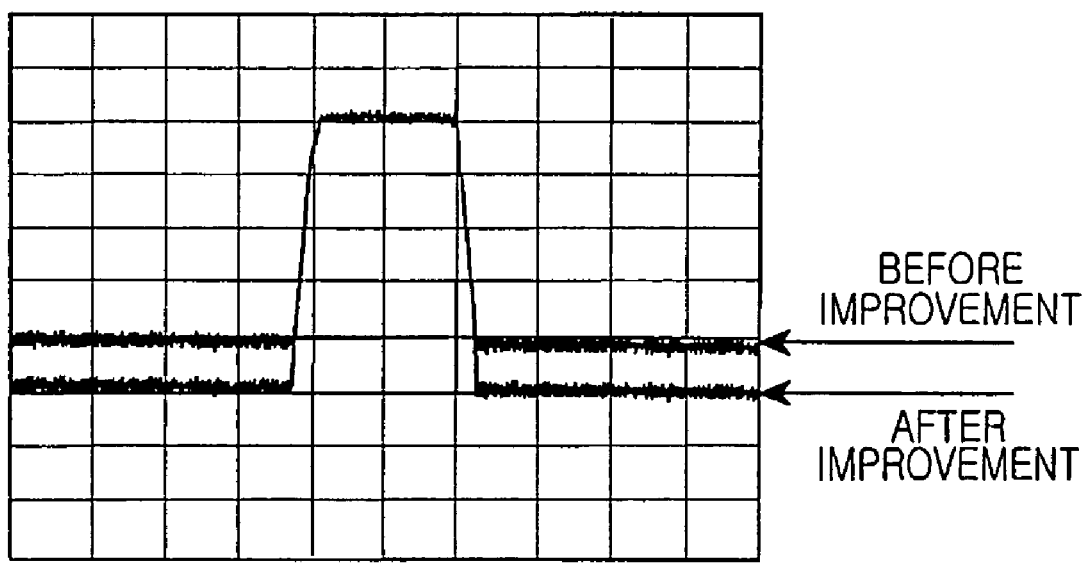
FIG. 3 is a graph illustrating an improved spurious characteristic of the high power amplifier according to an exemplary embodiment of the present invention.

FIG. 3 is a graph illustrating an improved spurious characteristic of the high power amplifier according to an exemplary embodiment of the present invention. Referring to FIG. 3, compared with the conventional high power amplifier, the high power amplifier of the present invention outputs the same magnitude of the signal, but has the improved spurious characteristic. In the case of a high power device such as an RF LDMOS used in a base station, the drain modulation occurs in the range between 2 V to 5 V. On the contrary, when the high power amplifier of an exemplary embodiment of the present invention is applied, the drain modulation can be almost removed.

As described above, the high power amplifier including the adder and the bias unit can minimize the drain modulation that occurs in the bias applied to the drain of the high power transistor and can improve the output characteristic of the high power transistor. Also, exemplary embodiments of the present invention can simply and efficiently improve the characteristic of the non-linear high power amplifier without using linearization techniques. In addition, the amplifier can be designed with transistors having a small capacity, and the improved spurious characteristic leads to the improvement of signal quality.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A bias controlling apparatus for a high power amplifier, the apparatus comprising:

an adder for supplying a current corresponding to a voltage reduced by a drain modulation; and a bias unit for adding the current supplied from the adder to a DC bias and supplying the added current to a drain of a transistor;

wherein the adder comprises a voltage source for supplying a current to an anode of a diode, and a capacitor for passing an AC component of the reduced voltage to operate the diode when the drain modulation occurs;

wherein the diode, which is turned on by the capacitor, transfers the current supplied from the voltage source to the capacitor at a level corresponding to the reduced voltage, so that the capacitor supplies the current supplied from the diode to the bias unit when the diode operates.

2. The bias controlling apparatus of claim 1, wherein the voltage source is a current limited circuit (CLC).

3. The bias controlling apparatus of claim 1, further comprising a first inductor connected between a power source and a cathode of the diode for supplying a DC offset voltage that determines an operation of the diode.

4. The bias controlling apparatus of claim 1, wherein the bias unit comprises:

a DC bias for supplying the current to the drain of the transistor; and a second inductor connected between the DC bias and the other terminal of the capacitor for supplying the DC bias to the transistor.

5. A method for reducing drain modulation in a high power amplifier, the method comprising:

supplying a current corresponding to a voltage reduced by a drain modulation;

adding the current supplied to a DC bias and supplying the added current to a drain of a transistor;

supplying a current to an anode of a diode;

passing an AC component of the reduced voltage via a capacitor to operate the diode when the drain modulation occurs; and transferring the current supplied to the capacitor at a level corresponding to the reduced voltage, so that the capacitor supplies the current supplied from the diode to a bias unit when the diode operates.

6. The method of claim 5, further comprising supplying a DC offset voltage that determines an operation of the diode.

7. The method of claim 5, further comprising:

supplying the current to the drain of the transistor; and supplying the DC bias to the transistor.

* * * * *